(12) United States Patent
Gee et al.

(10) Patent No.: US 11,812,639 B2
(45) Date of Patent: Nov. 7, 2023

(54) ELECTROLUMINESCENT DISPLAY DEVICE

(71) Applicant: LG Display Co., Ltd., Seoul (KR)

(72) Inventors: Hyuk-Chan Gee, Paju-si (KR);
Sang-Bin Lee, Paju-si (KR);
Nack-Youn Jung, Paju-si (KR);
Jeong-Mook Choi, Paju-si (KR);
Sung-Jin Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 433 days.

(21) Appl. No.: 17/115,358

(22) Filed: Dec. 8, 2020

(65) Prior Publication Data

US 2021/0193761 A1 Jun. 24, 2021

(30) Foreign Application Priority Data

Dec. 23, 2019 (KR) .................. 10-2019-0172999

(51) Int. Cl.
*H10K 59/122* (2023.01)
*H10K 59/88* (2023.01)
*H10K 59/35* (2023.01)
*H10K 59/123* (2023.01)

(52) U.S. Cl.
CPC ......... *H10K 59/122* (2023.02); *H10K 59/123* (2023.02); *H10K 59/352* (2023.02); *H10K 59/88* (2023.02)

(58) Field of Classification Search
CPC .......................... H10K 59/122; H10K 59/352
See application file for complete search history.

(56) References Cited

U.S. PATENT DOCUMENTS

2019/0229163 A1* 7/2019 Murai .................. H10K 59/124

FOREIGN PATENT DOCUMENTS

KR  10-2016-0033804 A   3/2016
KR  10-2017-0080288 A   7/2017

* cited by examiner

*Primary Examiner* — Daniel P Shook
(74) *Attorney, Agent, or Firm* — Fenwick & West LLP

(57) ABSTRACT

An electroluminescent display device includes a substrate including a first pixel column and a second pixel column that respectively include first pixels and second pixels arranged in a first direction and respectively have a first width and a second width in a second direction, wherein the second pixel column is positioned in the second direction from the first pixel column, and the second width is greater than the first width; a light emitting diode in each first pixel and each second pixel and including a first electrode, a light emitting layer and a second electrode; a first bank positioned between adjacent first pixels and between adjacent second pixels and covering an edge of the first electrode; a second bank positioned between the first and second pixel columns; and a first partition wall across the second pixel column along the first direction and positioned on the first electrode.

25 Claims, 5 Drawing Sheets

ELECTROLUMINESCENT DISPLAY DEVICE

CROSS-REFERENCE TO RELATED APPLICATIONS

The present application claims the benefit of Republic of Korea Patent Application No. 10-2019-0172999 filed in the Republic of Korea on Dec. 23, 2019, which is hereby incorporated by reference in its entirety.

BACKGROUND

Field of Technology

The present disclosure relates to a display device, and more particularly, to an electroluminescent display device having a large size and high resolution.

Discussion of the Related Art

An electroluminescent (EL) display device among new flat panel display devices is a self-emission type such that there are advantages in a viewing angle and a contrast ratio in comparison to a liquid crystal display device. In addition, since a backlight unit is not required in the EL display device, there are advantages of a thin profile and low power consumption.

The EL display device includes red, green and blue pixels, and the red, green and blue pixels respectively include red, green and blue emitting layers.

Generally, each emitting layer may be formed by selectively depositing an emitting material through a vacuum thermal evaporation process using a fine metal mask. However, since a mask, i.e., the fine metal mask, is required in the deposition process, the production cost is increased. In addition, the above deposition process is not adequate to fabricate an EL display device having a large size and high resolution.

SUMMARY

Accordingly, the present disclosure is directed to an electroluminescent display device that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present disclosure, as embodied and broadly described herein, an electroluminescent display device includes a substrate including a first pixel column and a second pixel column, wherein the first and second pixel columns respectively include a plurality of first pixels and a plurality of second pixels arranged in a first direction and respectively have a first width and a second width in a second direction perpendicular to the first direction, and wherein the second pixel column is positioned in the second direction from the first pixel column, and the second width is greater than the first width; a light emitting diode in each first pixel and each second pixel and including a first electrode, a light emitting layer and a second electrode; a first bank positioned between adjacent first pixels and between adjacent second pixels and covering an edge of the first electrode; a second bank positioned between the first and second pixel columns and extending along the first direction; and a first partition wall being across the second pixel column along the first direction and positioned on the first electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Reference will now be made in detail to the preferred embodiments, examples of which are illustrated in the accompanying drawings.

Figure 1:
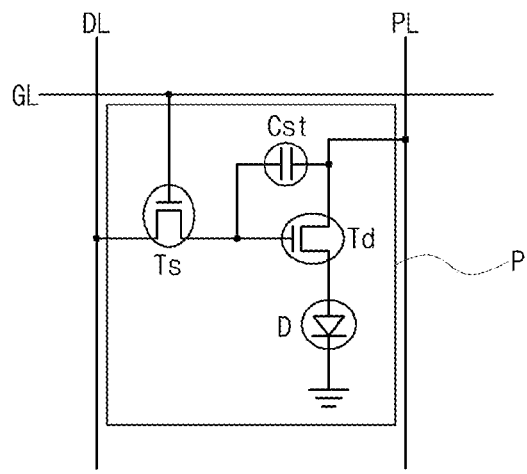
FIG. 1 is a schematic circuit diagram of an EL display device according to one embodiment of the present disclosure.

FIG. 1 is a schematic circuit diagram of an EL display device according to the present disclosure.

As shown in FIG. 1, an EL display device includes a gate line GL, a data line DL, a power line PL, a switching thin film transistor (TFT) Ts, a driving TFT Td, a storage capacitor Cst, and a light emitting diode D. The gate line GL and the data line DL cross each other to define a pixel region P. The switching TFT Ts, the driving TFT Td, the storage capacitor Cst and the light emitting diode D are formed in the pixel region P.

The switching TFT Ts is connected to the gate and data line GL and DL, and the driving TFT Td and the storage capacitor Cst are connected to the switching TFT Ts and the power line PL. The light emitting diode D is connected to the driving TFT Td.

In the EL display device, when the switching TFT Ts is turned on by a gate signal applied through the gate line GL, a data signal from the data line DL is applied to the gate electrode of the driving TFT Td and an electrode of the storage capacitor Cst.

When the driving TFT Td is turned on by the data signal, an electric current is supplied to the light emitting diode D from the power line PL. As a result, the light emitting diode D emits light. In this case, when the driving TFT Td is turned on, a level of an electric current applied from the power line PL to the light emitting diode D is determined such that the light emitting diode D can produce a gray scale.

The storage capacitor Cst serve to maintain the voltage of the gate electrode of the driving TFT Td when the switching TFT Ts is turned off. Accordingly, even if the switching TFT Ts is turned off, a level of an electric current applied from the power line PL to the light emitting diode D is maintained to next frame. Accordingly, the EL display device displays an image.

Figure 2:
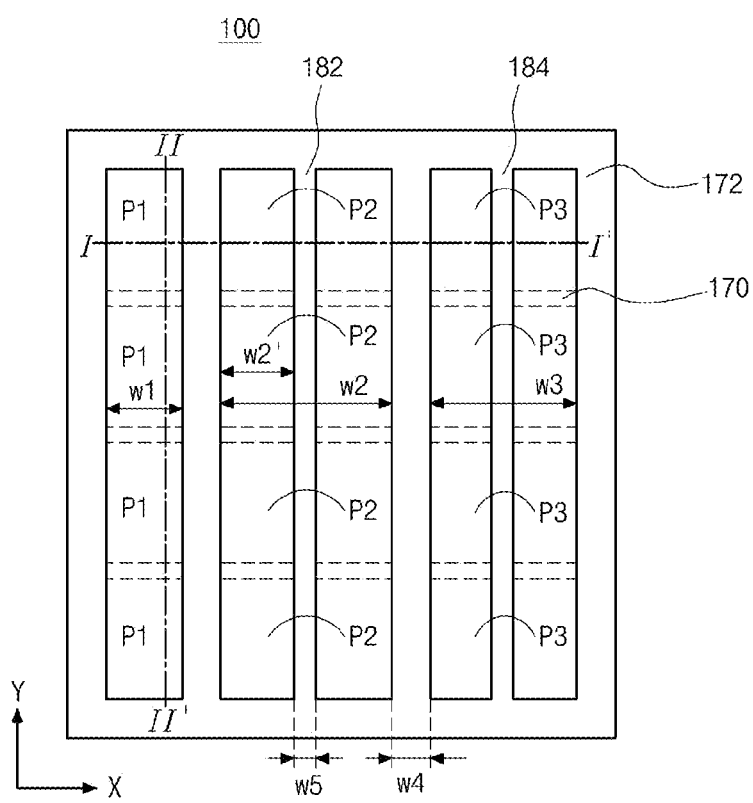
FIG. 2 is a schematic plan view of a part of an EL display device according to a first embodiment of the present disclosure.

FIG. 2 is a schematic plan view of a part of an EL display device according to a first embodiment of the present disclosure.

As shown in FIG. 2, the EL display device 100 according to the first embodiment of the present disclosure includes first to third pixels P1, P2 and P3. The different color pixels are arranged along a first direction X, and the same color pixels are arranged along a second direction Y. Namely, the first to third pixels P1 to P3, which are different from each other, are sequentially arranged along the first direction X, and the first pixels P1, the second pixels P2, and the third pixels P3 are respectively arranged along the second direction Y. For example, the first pixel P1 may be a red pixel, the second pixel P2 may be a blue pixel, and the third pixel P3 may be a green pixel.

Since the second pixel P2 as the blue pixel has bad emitting properties, e.g., an emitting efficiency and/or a lifespan, the second pixel P2 has an area (or size) being larger than each of the first and third pixels P1 and P3. For example, the first to third pixels P1 to P3 respectively have first to third widths W1, W2 and W3, and the third width W3 is greater than the first width W1 and smaller than the second width W2.

A first bank 170 is disposed in a portion between adjacent same color pixels arranged along the second direction Y. The first bank 170 is disposed between adjacent first pixels P1, between adjacent second pixels P2, and between adjacent third pixels P3. Namely, the first pixel 170 extends between same pixels, which are adjacent along the second direction Y, along the first direction X. Alternatively, the first bank 170 may be omitted.

A second bank 172 is disposed in a portion between adjacent two pixel among the first to third pixels P1 to P3 in the first direction X. The second bank 172 is disposed between the first and second pixels P1 and P2, between the second and third pixels P2 and P3, and between the third and first pixels P3 and P1. Namely, the second bank 172 extends between different pixels, which are adjacent along the first direction X, along the second direction Y. The second bank 172 has an opening in correspondence to the same color pixels arranged along the second direction Y. The second bank 172 has a single opening in correspondence to all of the first pixels P1, all of the second pixels P2 or all of the third pixels P3 in one pixel column. Namely, the opening of the second bank 172 extends along the second direction Y, and a length of the opening in the second direction Y is larger than a length of the opening in the first direction X.

The first bank 170 may include a hydrophilic material to have a hydrophilic property. The second bank 172 may include a first pattern (not shown) including a hydrophilic material and a second pattern (not shown) including a hydrophobic material and positioned on the first pattern. In this instance, the first pattern may include the same material as the first bank 170 and may extend from the first bank 170. The second bank 172 may include the second pattern without the first pattern.

A first partition wall (or a pixel dividing pattern) 182 being across a pixel column of the second pixel P2 is disposed in the second pixel P2 along the second direction Y. Namely, the second pixel P2 is divided into two regions by the first partition wall 182.

In addition, a second partition wall 184 being across a pixel column of the third pixels P3 is disposed in the third pixel P3 along the second direction Y. Namely, the third pixel P3 is divided into two regions by the second partition wall 184.

The second bank 172 may have a fourth width W4, and each of the first and second partition walls 182 and 184 may have a fifth width W5 equal to or smaller than the fourth width W4. Since the first and second partition walls 182 and 184 are located in an emission region, the width of the first and second partition walls 182 and 184 can be reduced to reduce the decrease of the emission area. In FIG. 2, the first and second partition walls 182 and 184 have the same width. Alternatively, the width of the second partition wall 184 formed in the third pixel P3 having the third width W3 smaller than the second width W2 of the second pixel P2 may be smaller than that of the first partition wall 182 such that it is possible to make the widths of the regions, where the light emitting layer in the second and third pixels P2 and P3 is formed, substantially the same. For example, by adjusting the widths of the first and second partition walls 182 and 184, the first width W1 of the first pixel P1, a width W2' of the divided region of the second pixel P2, and a width of the divided region of the third pixel P3 can be substantially equal.

In the EL display device of the present disclosure, the light emitting diode including the light emitting layer are formed in each of the pixels P1, P2, and P3, and the light emitting layer is formed by a solution process. Namely, the light emitting layer can be formed by a solution process without a mask such that the manufacturing cost of the EL display device is reduced and the EL display device having a large size and high resolution can be provided.

In addition, since the light emitting layers having the same color are integrally formed to be connected to each other, variations (or deviations) in the dropping amount of nozzles can be reduced, and a thickness of the light emitting layer in each pixel can be uniform.

However, in each pixel column in which the pixels P1, P2, and P3 of the same color are arranged along the second direction Y, a solution is shifted from the end of the pixel column to the center of the pixel column. Accordingly, a region, in which the light emitting layer is not formed, is generated in a pixel at the end of the pixel column, or a thickness nonuniformity problem of the light emitting layer occurs.

When a width of the pixel column is relatively small, the solution shift problem is not generated or reduced. On the other hand, when a width of the pixel column is relatively large, the solution shift problem is significantly generated.

Namely, the solution shift problem may be greater in the second pixel P2 as the blue pixel and/or the third pixel P3 as the green pixel, each of which has a width being greater than the first pixel P1 as the red pixel, than the first pixel P1.

However, in the EL display device of the present disclosure, the first partition wall 182 extending along the second direction Y is formed in the second pixel P2, which has relatively large width in the first direction X, such that the second pixel P2 is divided into two regions having reduced width. Accordingly, each region in the second pixel X2 has relatively small width such that the solution shift problem in the second pixel P2 is prevented or minimized.

In addition, the second partition wall 184 extending along the second direction Y is formed in the third pixel P3 such that the third pixel P3 is divided into two regions having reduced width. Accordingly, each region in the third pixel P3 has relatively small width such that the solution shift problem in the third pixel P3 is prevented or minimized.

In FIG. 2, the first and second partition walls 182 and 184 are respectively disposed in the second and third pixels P2 and P3. Alternatively, the second partition wall 184 formed in the third pixel P3, which has a width being smaller than the second pixel P2, may be omitted.

Figure 3:
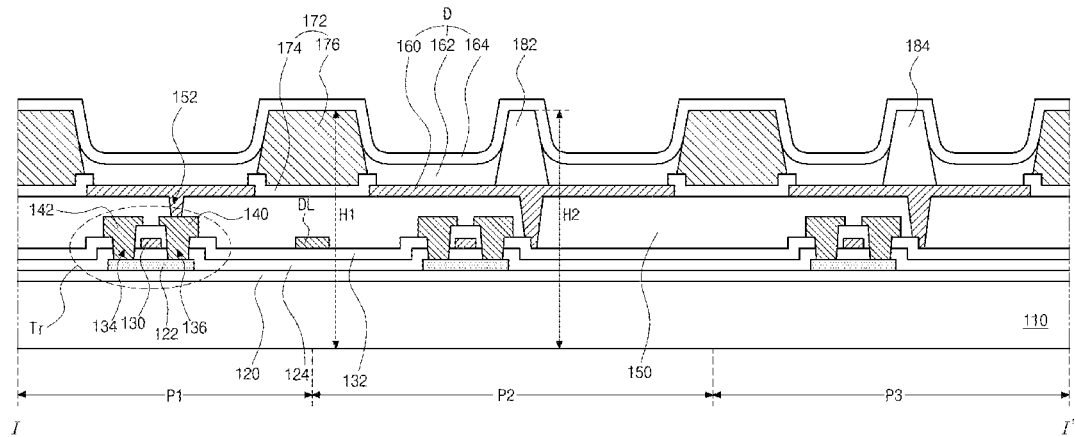
FIG. 3 is a cross-sectional view taken along the line I-I' of FIG. 2 according to one embodiment of the present disclosure.
Figure 4:
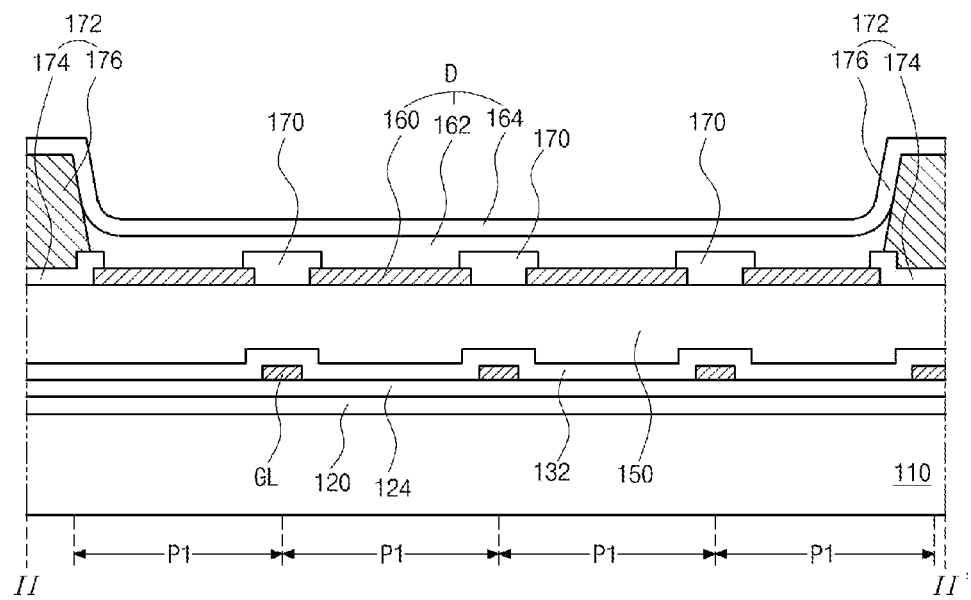
FIG. 4 is a cross-sectional view taken along the line II-IP of FIG. 2 according to one embodiment of the present disclosure.

FIG. 3 is a cross-sectional view taken along the line I-I' of FIG. 2, and FIG. 4 is a cross-sectional view taken along the line II'-II' of FIG. 2.

Referring to FIGS. 3 and 4 with FIG. 2, on a substrate 110, where the first to third pixels P1, P2, and P3 are defined, the TFT Tr, the light emitting diode D, which is connected to the TFT Tr, the first bank 170, which is formed at the boundary of the adjacent pixel along the first direction X, the second bank 172, which is formed at the boundary of the adjacent pixel along the second direction Y, the first partition wall 182 being across the second pixel P2 along the second direction Y, and the second partition wall 184 being across the third pixel P3 along the second direction Y are formed.

The substrate 110 may be a glass substrate or a plastic substrate. For example, the substrate 110 may be a polyimide substrate.

A buffer layer 120 is formed on the substrate 110, and the TFT Tr is formed on the buffer layer 120. The buffer layer 120 may include an inorganic material, e.g., silicon oxide or silicon nitride, and may have a single-layered structure or a double-layered structure. The buffer layer 120 may be omitted.

A semiconductor layer 122 is formed on the buffer layer 120. The semiconductor layer 122 may include an oxide semiconductor material or polycrystalline silicon.

When the semiconductor layer 122 includes the oxide semiconductor material, a light-shielding pattern (not shown) may be formed under the semiconductor layer 122. The light to the semiconductor layer 122 is shielded or blocked by the light-shielding pattern such that thermal degradation of the semiconductor layer 122 can be prevented. On the other hand, when the semiconductor layer 122 includes polycrystalline silicon, impurities may be doped into both sides of the semiconductor layer 122.

A gate insulating layer 124 is formed on the semiconductor layer 122. The gate insulating layer 124 may be formed of an inorganic insulating material such as silicon oxide or silicon nitride.

A gate electrode 130 and a gate line GL, each of which is formed of a conductive material, e.g., metal, is formed on the gate insulating layer 124. The gate electrode 130 corresponds to a center of the semiconductor layer 122. The gate line GL extends along the first direction X. The gate line GL may overlap the first bank 170.

In FIG. 3, the gate insulating layer 124 is formed on an entire surface of the substrate 110. Alternatively, the gate insulating layer 124 may be patterned to have the same shape as the gate electrode 130.

An interlayer insulating layer 132, which is formed of an insulating material, is formed on the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 122. The first and second contact holes 134 and 136 are positioned at both sides of the gate electrode 130 to be spaced apart from the gate electrode 130.

In FIG. 3, the first and second contact holes 134 and 136 are formed through the gate insulating layer 124. Alternatively, when the gate insulating layer 124 is patterned to have the same shape as the gate electrode 130, the first and second contact holes 134 and 136 is formed only through the interlayer insulating layer 132.

A source electrode 142, a drain electrode 140 and a data line DL, each of which is formed of a conductive material, e.g., metal, are formed on the interlayer insulating layer 132.

The source electrode 142 and the drain electrode 140 are spaced apart from each other with respect to the gate electrode 130 and respectively contact both sides of the semiconductor layer 122 through the first and second contact holes 134 and 136. The data line DL extends along the second direction Y. The data line DL crosses the gate line GL to define the pixels P1, P2 and P3. The data line DL may overlap the second bank 172.

The semiconductor layer 122, the gate electrode 130, the source electrode 142 and the drain electrode 140 constitute the TFT Tr. The TFT Tr may serve as a driving element. Namely, the TFT Tr may be the driving TFT Td.

In the TFT Tr, the gate electrode 130, the source electrode 142, and the drain electrode 140 are positioned over the semiconductor layer 122. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, the switching TFT Ts (of FIG. 1) may be further formed on the substrate 110. The switching TFT Ts is connected to the TFT Tr as the driving TFT.

In addition, the power line PL (of FIG. 1) is formed to be parallel to and spaced apart from the data line DL or the gate line GL. The storage capacitor Cst (of FIG. 1) for maintaining the voltage of the gate electrode of the TFT Tr as the driving TFT is further formed.

A passivation layer (or planarization layer) 150 including a drain contact hole 152, which exposes the drain electrode 140 of the TFT Tr, is formed to cover the TFT Tr.

A first electrode 160 is formed on the passivation layer 150 and is connected to the drain electrode 142 of the TFT Tr through the drain contact hole 152. The first electrode 160 is separated in each of the first to third pixels P1, P2 and P3. The first electrode 160 may be formed of a conductive material having a relatively high work function to serve as an anode. For example, the first electrode 160 may be formed of a transparent conductive material such as indium-tin-oxide (ITO) or indium-zinc-oxide (IZO), but it is not limited thereto.

When the EL display device 100 is operated in a top-emission type, a reflection electrode or a reflection layer may be formed under the first electrode 160. For example, the reflection electrode or the reflection layer may be formed of silver (Ag) or aluminum-palladium-copper (APC) alloy. The first electrode 160 may have a triple-layered structure of ITO/APC/ITO or ITO/Ag/ITO, but it is not limited thereto.

The first and second banks 170 and 172 covering edges of the first electrode 160 are formed on the passivation layer 150. The first and second banks 170 and 172 exposes a center of the first electrode 160 in the first to third pixels P1, P2 and P3. The first bank 170 has a thickness (or height) being smaller than the second bank 172. The second bank 172 may include first and second patterns 174 and 176 sequentially stacked.

In the pixel column of the second pixel P2, the first partition wall 182 being across (running across) the second pixel P2 along the second direction Y is formed. In addition, in the pixel column of the third pixel P3, the second partition wall 184 being across (running across) the third pixel P3 along the second direction Y is formed.

Each of the first and second partition walls 182 and 184 may be formed of the same material as the second pattern 176 of the second bank 172. Namely, each of the first and second partition walls 182 and 184 may be formed of a hydrophobic material to have a hydrophobic property. Alternatively, each of the first and second partition walls 182 and 184 may be formed of a hydrophilic material to have a hydrophilic property.

In addition, each of the first and second partition walls 182 and 184 may have a double-layered structure of a lower pattern and an upper pattern. The lower and the upper pattern may be formed of the same material as the first and second patterns 174 and 176 of the second bank 172, respectively.

Moreover, the first bank 170, the second bank 172, the first partition wall 182 and the second partition wall 184 may be formed of the same process. For example, by forming an organic material layer having a hydrophobic top surface over an entire surface of the substrate 110 and patterning the organic material layer using a half-tone mask, which includes a transmissive area, a blocking area and a half-transmissive area, the first bank 170, the second bank 172, the first partition wall 182 and the second partition wall 184 having different widths and different thicknesses may be formed.

The second bank 172 has a first height H1 from the substrate 110, and the first partition wall 182 has a second height H2 from the substrate 110. The second height H2 may be equal to or smaller than the first height H1.

The second bank 172 should have a predetermined height to prevent color mixing between adjacent pixels of different colors. However, since the light emitting layers of the same color are coated on both sides of the first partition wall 182, the first partition wall 182 may have a height being smaller than the bank 172. In addition, the second partition wall 184 may have substantially the same height as the first partition wall 182.

For example, the second pixel P2 is divided by the first partition wall 182, but the first electrode 160 in two regions divided by the first partition wall 182 is connected to one TFT Tr. Namely, the two regions separated by the first partition wall 182 constitute the second pixel P2.

A light emitting layer 162 is formed on the first electrode 160 of each pixel P1, P2, P3. For example, the light emitting layer 162 may include a first charge auxiliary layer, an emitting material layer, and a second charge auxiliary layer sequentially stacked on the first electrode 160. The light emitting material layer 162 is formed by coating red, blue, and green emitting materials on the first to third pixels P1, P2, and P3. The emitting material may be an organic emitting material, such as a phosphorescent compound or a fluorescent compound, or an inorganic emitting material such as a quantum dot.

The first charge auxiliary layer may be a hole auxiliary layer, and the hole auxiliary layer may include at least one of a hole injection layer (HIL) and a hole transporting layer (HTL). The second charge auxiliary layer may be an electron auxiliary layer, and the electron auxiliary layer may include at least one of an electron injection layer (EIL) and an electron transporting layer (ETL). However, the present disclosure is not limited thereto.

The light emitting layer 162 is formed through a solution process. Accordingly, the process can be simplified, and a large-size and high-resolution display device can be provided. For example, the solution process may be a spin-coating method, an inkjet-printing method, or a screen-printing method, but it is not limited thereto.

For example, an emitting material solution is coated to a pixel column of the first pixels P1 and dried to form the light emitting layer 162 in the plurality of first pixels P1 arranged in the second direction Y. In this case, the light emitting layers 162 of the first pixels P1 adjacent in the second direction Y are connected to each other and are formed to cover the first bank 170.

An emitting material solution is coated to a pixel column of the second pixels P2 and dried to form the light emitting layer 162 in the plurality of second pixels P2 arranged in the second direction Y. In this case, the light emitting layers 162 of the second pixels P2 adjacent in the second direction Y are connected to each other and are formed to cover the first bank 170. Since the first partition wall 182 being across the second pixel P2 is formed along the second direction Y, the light emitting layer 162 in the second pixel P2 is divided by the first partition wall 182. Namely, in the pixel column of the second pixel P2, the emitting layer 162 is continuous in adjacent second pixels P2 and is separated (or divided) in one second pixel P2.

As mentioned above, when the light emitting layer 162 is formed by a solution process, a solution shift problem in the second direction Y is generated in the second pixel P2, which has a width being greater than the first pixel P1. However, in the EL display device of the present disclosure, the second pixel P2 is divided by the first partition wall 182 such that a width of the region, where the emitting material solution is coated, is reduced. Accordingly, the solution shift problem in the second pixel P2 is prevented or reduced.

An emitting material solution is coated to a pixel column of the third pixels P3 and dried to form the light emitting layer 162 in the plurality of third pixels P3 arranged in the second direction Y. In this case, the light emitting layers 162 of the third pixels P3 adjacent in the second direction Y are connected to each other and are formed to cover the first bank 170. Since the second partition wall 184 being across the third pixel P2 is formed along the second direction Y, the light emitting layer 162 in the third pixel P3 is divided by the second partition wall 184. Namely, in the pixel column of the third pixel P3, the emitting layer 162 is continuous in adjacent third pixels P3 and is separated (or divided) in one third pixel P3.

Since the third pixel P3 is divided by the second partition wall 184, the solution shift problem in the third pixel P3 is prevented or reduced.

Accordingly, problems in that the light emitting layer is not formed or a thickness of the light emitting layer is non-uniform in a part of the pixel of the pixel column of the second pixel P2 or the third pixel P3 can be prevented.

The first partition wall 182 in the second pixel P2 and the second partition wall 184 in the third pixel P3 may correspond to the TFT Tr and/or the drain contact hole 152. Namely, the first partition wall 182 in the second pixel P2 and the second partition wall 184 in the third pixel P3 may overlap the TFT Tr and/or the drain contact hole 152.

For example, a step difference in the first electrode 160 may be generated by the drain contact hole 152 such that a thickness non-uniformity problem in the light emitting layer 162 may be generated. However, when the first and second partition walls 182 and 184 are formed to correspond to the drain contact hole 152, the above problem can be prevented.

On the other hand, the electron auxiliary layer of the light emitting layer 162 may be formed by a deposition process. In this instance, the electron auxiliary layer may be substantially formed over an entire of the substrate 110.

A second electrode 164 is formed on the light emitting layer 162, the second bank 172, and the first and second partition walls 182 and 184 and over an entire of the substrate 110. The second electrode 164 may be formed of a conductive material having a relatively low work function to serve as a cathode. For example, the second electrode 164 may be formed of aluminum (Al), magnesium (Mg), silver (Ag) or their alloy. Alternatively, the second electrode 164 may be formed of a transparent conductive material such as indium-gallium-oxide (IGO), but it is not limited thereto. As mentioned above, the EL display device 100 of the present disclosure may be a top-emission type. As a result, the second electrode 164 has relatively small thickness in order to transmit the light from the light emitting layer 162.

The first electrode 160, the light emitting layer 162 and the second electrode 164 constitute the light emitting diode D.

Although not shown, an encapsulation film may be formed on or over the second electrode 164 to prevent penetration of moisture into the light emitting diode D. The encapsulation film may have a triple-layered structure of a first inorganic layer, an organic layer and a second inorganic layer, but it is not limited thereto.

In addition, a polarization plate may be disposed on the encapsulation film to reduce an ambient light reflection. The polarization plate may be a circular polarization film.

Moreover, a cover window may be attached to the encapsulation film or the polarization plate. For example, the substrate 110 and the cover window may have a flexible property such that a flexible EL display device may be provided.

Figure 5:
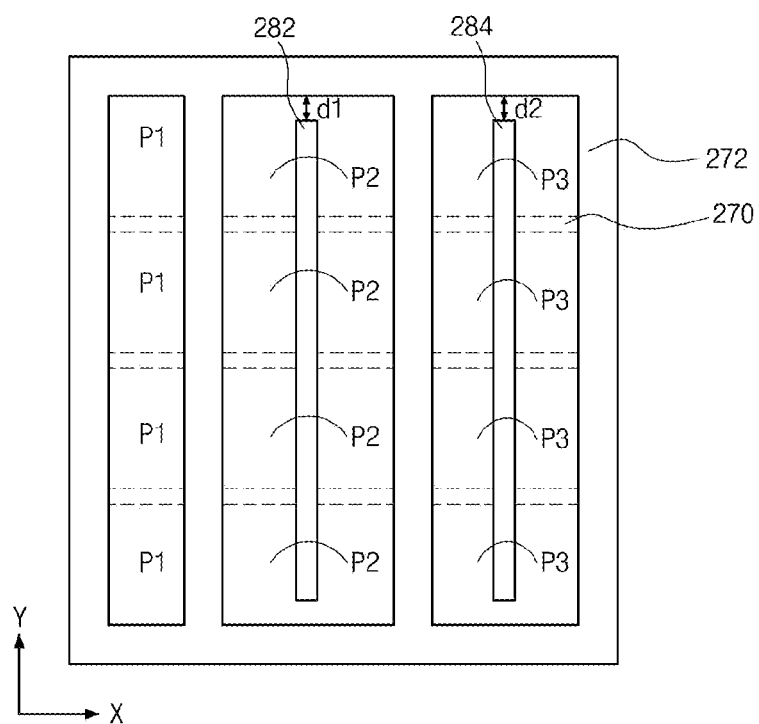
FIG. 5 is a schematic plan view of a part of an EL display device according to a second embodiment of the present disclosure.

FIG. 5 is a schematic plan view of a part of an EL display device according to a second embodiment of the present disclosure.

As shown in FIG. 5, the EL display device 200 according to the second embodiment of the present disclosure includes first to third pixels P1, P2 and P3. The different color pixels are arranged along a first direction X, and the same color pixels are arranged along a second direction Y. Namely, the first to third pixels P1 to P3, which are different from each other, are sequentially arranged along the first direction X, and the first pixels P1, the second pixels P2 and the third pixels P3 are respectively arranged along the second direction Y. For example, the first pixel P1 may be a red pixel, the second pixel P2 may be a blue pixel, and the third pixel P3 may be a green pixel. The light emitting diode D is disposed in each pixel P1, P2 and P3.

The first to third pixels P1, P2 and P3 respectively have first to third widths W1, W2 and W3. The third width W3 is greater than the first width W1 and smaller than the second width W2.

A first bank 270 is disposed in a portion between adjacent same color pixels arranged along the second direction Y. The first bank 270 is disposed between adjacent first pixels P1, between adjacent second pixels P2, and between adjacent third pixels P3. Namely, the first pixel 270 extends between same pixels, which are adjacent along the second direction Y, along the first direction X. Alternatively, the first bank 270 may be omitted.

A second bank 272 is disposed in a portion between adjacent two pixel among the first to third pixels P1 to P3 in the first direction X. The second bank 272 is disposed between the first and second pixels P1 and P2, between the second and third pixels P2 and P3, and between the third and first pixels P3 and P1. Namely, the second bank 272 extends between different pixels, which are adjacent along the first direction X, along the second direction Y. The second bank 272 has an opening in correspondence to the same color pixels arranged along the second direction Y. The second bank 272 has a single opening in correspondence to all of the first pixels P1, all of the second pixels P2 or all of the third pixels P3 in one pixel column. Namely, the opening of the second bank 272 extends along the second direction Y, and a length of the opening in the second direction Y is larger than a length of the opening in the first direction X.

The first bank 270 may include a hydrophilic material to have a hydrophilic property. The second bank 272 may include a first pattern (not shown) including a hydrophilic material and a second pattern (not shown) including a hydrophobic material and positioned on the first pattern. In this instance, the first pattern may include the same material as the first bank 270 and may extend from the first bank 270. The second bank 272 may include the second pattern without the first pattern.

A first partition wall 282 being across a pixel column of the second pixels P2 is disposed along the second direction Y. Namely, the second pixel P2 is divided into two regions by the first partition wall 282.

In at least one end of the pixel column of the second pixels P2, the first partition wall 282 is spaced apart from the second bank 272 by a first distance d1. Namely, in at least one end of the pixel column of the second pixels P2, there is a space between the first partition wall 282 and the second bank 272. In the second direction Y, a length of the space between the first partition wall 282 and the second bank 272 is smaller than a length of the second pixel P2. Namely, an end of the first partition wall 282 is disposed in the second pixel P2 at the end of the pixel column of the second pixels P2.

In addition, a second partition wall 284 being across a pixel column of the third pixels P3 is disposed along the second direction Y. Namely, the third pixel P3 is divided into two regions by the second partition wall 284.

In at least one end of the pixel column of the third pixels P3, the second partition wall 284 is spaced apart from the second bank 272 by a second distance d2. Namely, in at least one end of the pixel column of the third pixels P3, there is a space between the second partition wall 284 and the second bank 272. In the second direction Y, a length of the space between the second partition wall 284 and the second bank 272 is smaller than a length of the third pixel P3. Namely, an end of the second partition wall 284 is disposed in the third pixel P3 at the end of the pixel column of the third pixels P3.

The first distance d1 between the first partition wall 282 and the second bank 272 may be equal to or larger than the second distance d2 between the second partition wall 284 and the second bank 272.

The second bank 272 may have a fourth width W4, and each of the first and second partition walls 282 and 284 may have a fifth width W5 equal to or smaller than the fourth width W4. A width of the second partition wall 282 in the third pixel P3 may be equal to or smaller than a width of the first partition wall 282 in the second pixel P2.

In FIG. 5, the first and second partition walls 282 and 284 are respectively disposed in the second and third pixels P2 and P3. Alternatively, the second partition wall 284 in the third pixel P3, which has a width being smaller than the second pixel P2, may be omitted.

In the EL display device of the present disclosure, the light emitting diode including the light emitting layer are formed in each of the pixels P1, P2, and P3, and the light emitting layer is formed by a solution process. Namely, the light emitting layer can be formed by a solution process without a mask such that the manufacturing cost of the EL display device is reduced and the EL display device having a large size and high resolution can be provided.

In addition, since the light emitting layers having the same color are integrally formed to be connected to each other, variations (or deviations) in the dropping amount of nozzles can be reduced, and a thickness of the light emitting layer in each pixel can be uniform.

Moreover, since the first and second partition walls 282 and 284 are respectively formed in the second and third pixels P2 and P3, each of which has a width in the first direction X being larger than the first pixel P1, the solution shift problem in the second and third pixels P2 and P3 is prevented or reduced.

Furthermore, since the first partition wall 282 is spaced apart from the second bank 272 in at least one end of the pixel column of the second pixels P2, a flow path of the fluid, i.e., an emitting material solution, is provided in the pixel column of the second pixels P2. As a result, the thickness uniformity of the organic emitting layer in the second pixel P2 is further improved. Similarly, since the second partition wall 284 is spaced apart from the second bank 272 in at least one end of the pixel column of the third pixels P3, a flow path of the fluid, i.e., an emitting material solution, is provided in the pixel column of the third pixels P3. As a result, the thickness uniformity of the organic emitting layer in the third pixel P3 is further improved.

Figure 6:
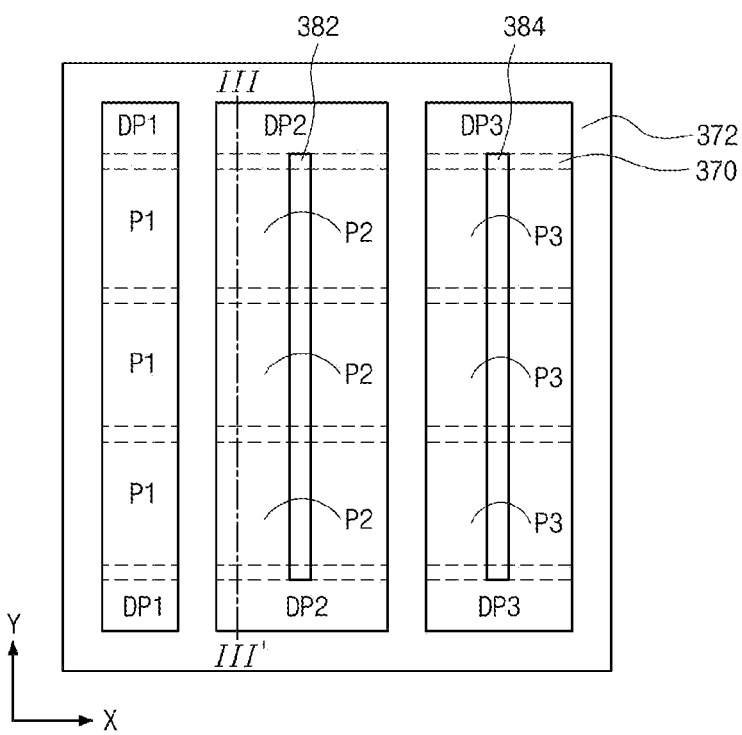
FIG. 6 is a schematic plan view of a part of an EL display device according to a third embodiment of the present disclosure.

FIG. 6 is a schematic plan view of a part of an EL display device according to a third embodiment of the present disclosure.

As shown in FIG. 6, the EL display device 300 according to the second embodiment of the present disclosure includes first to third pixels P1, P2 and P3 and first to third dummy pixels DP1, DP2, DP3. The different color pixels are arranged along a first direction X, and the same color pixels are arranged along a second direction Y to form first to third pixel columns. The first to third dummy pixels DP1, DP2 and DP3 are respectively positioned at both ends of the first to third pixel columns, respectively.

For example, the first pixel P1 may be a red pixel, the second pixel P2 may be a blue pixel, and the third pixel P3 may be a green pixel. The light emitting diode D is disposed in each pixel P1, P2 and P3.

The first to third pixels P1, P2 and P3 respectively have first to third widths W1, W2 and W3. The third width W3 is greater than the first width W1 and smaller than the second width W2.

A first bank 370 is disposed in a portion between adjacent same color pixels arranged along the second direction Y and between each of the dummy pixels DP1, DP2 and DP3 and each of the pixels P1, P2 and P3. The first bank 370 is disposed between adjacent first pixels P1, between adjacent second pixels P2, between adjacent third pixels P3, between the first dummy pixel DP1 and the first pixel P1, between the second dummy pixel DP2 and the second pixel P2, and between the third dummy pixel DP3 and the third pixel P3. Namely, the first bank 370 extends between same color pixels, which are adjacent along the second direction Y, along the first direction X and between each dummy pixel DP1, DP2 and DP3 and each pixel P1, P2 and P3, which are adjacent along the second direction Y, along the first direction X. Alternatively, the first bank 370 may be omitted.

A second bank 372 is disposed in a portion between adjacent two pixels among the first to third pixels P1 to P3 in the first direction X and a portion between adjacent two pixels among the first to third dummy pixels DP1 to DP3. The second bank 372 is disposed between the first and second pixels P1 and P2, between the second and third pixels P2 and P3, between the third and first pixels P3 and P1, between the first and second dummy pixels DP1 and DP2, between the second and third dummy pixels DP2 and DP3, and between the third and first dummy pixels DP3 and DP1. Namely, the second bank 372 extends between different pixels, which are adjacent along the first direction X, along the second direction Y and between the dummy pixels DP1 to DP3, which are adjacent along the first direction X, along the second direction Y. The second bank 372 has an opening in correspondence to the same color pixels and the dummy pixel arranged along the second direction Y. The second bank 372 has a single opening in correspondence to all of the first pixels P1 and the first dummy pixel DP1 in the first pixel column, all of the second pixels P2 and the second dummy pixel DP2 in the second pixel column, or all of the third pixels P3 and the third dummy pixel DP3 in the third pixel column. Namely, the opening of the second bank 372 extends along the second direction Y, and a length of the opening in the second direction Y is larger than a length of the opening in the first direction X.

The first bank 370 may include a hydrophilic material to have a hydrophilic property. The second bank 372 may include a first pattern (not shown) including a hydrophilic material and a second pattern (not shown) including a hydrophobic material and positioned on the first pattern. In this instance, the first pattern may include the same material as the first bank 370 and may extend from the first bank 370. The second bank 372 may include the second pattern without the first pattern.

A first partition wall 382 being across the second pixel column of the second pixels P2 is disposed along the second direction Y. Namely, the second pixel P2 is divided into two regions by the first partition wall 382.

In at least one end of the second pixel column of the second pixels P2, the first partition wall 382 is spaced apart from the second bank 372 by a length of the second dummy pixel DP2. Namely, in at least one end of the second pixel column of the second pixels P2, there is a space having the length of the second dummy pixel DP2 between the first partition wall 382 and the second bank 372.

In addition, a second partition wall 384 being across the third pixel column of the third pixels P3 is disposed along the second direction Y. Namely, the third pixel P3 is divided into two regions by the second partition wall 384.

In at least one end of the third pixel column of the third pixels P3, the second partition wall 384 is spaced apart from the second bank 372 by a length of the third dummy pixel DP3. Namely, in at least one end of the third pixel column of the third pixels P3, there is a space having the length of the third dummy pixel DP3 between the second partition wall 384 and the second bank 372.

Alternatively, the first and second partition walls 382 and 384 may respectively extend from the second bank 372 to be across the second and third dummy pixels DP2 and DP3. Namely, the second and third dummy pixels DP2 and DP3 may be divided by the first and second partition walls 382 and 384, respectively.

Alternatively, the first and second partition walls 382 and 384 may extend into a portion of the second and third dummy pixels DP2 and DP3, respectively. In this instance, a first distance between the first partition wall 382 and the second bank 372 may be equal to or greater than a second distance between the second partition wall 384 and the second bank 372.

The second bank 372 may have a fourth width W4, and each of the first and second partition walls 382 and 384 may have a fifth width W5 equal to or smaller than the fourth width W4. A width of the second partition wall 384 in the third pixel P3 may be equal to or smaller than a width of the first partition wall 382 in the second pixel P2.

In FIG. 6, the first and second partition walls 382 and 384 are respectively disposed in the second and third pixels P2 and P3. Alternatively, the second partition wall 384 in the third pixel P3, which has a width being smaller than the second pixel P2, may be omitted.

Figure 7:
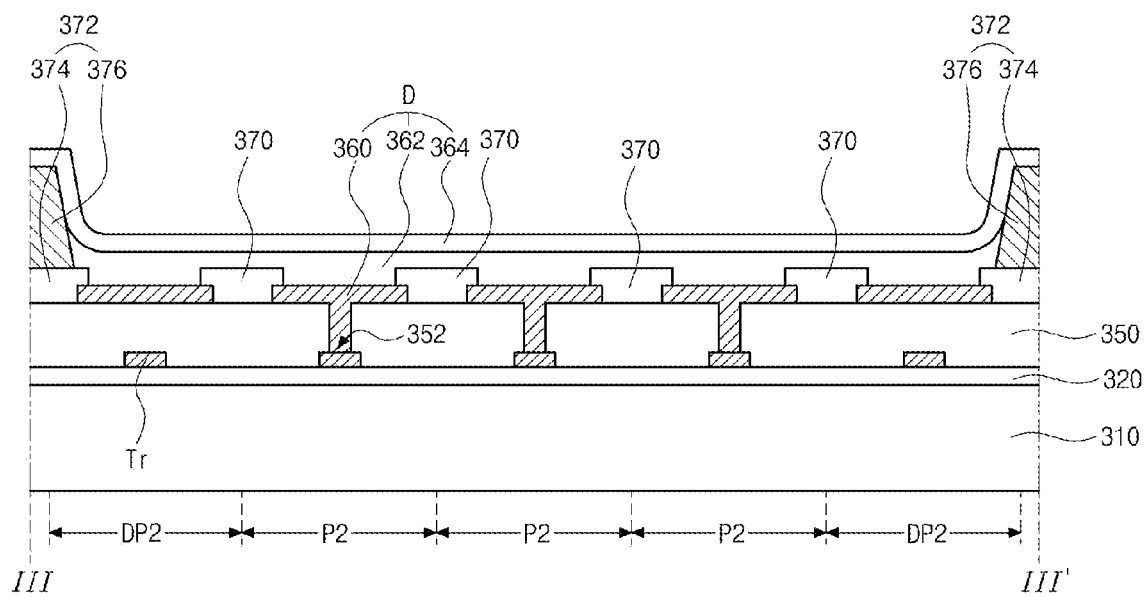
FIG. 7 is a cross-sectional view taken along the line of FIG. 6 according to one embodiment of the present disclosure.

FIG. 7 is a cross-sectional view taken along the line of FIG. 6.

Referring to FIG. 7 with FIGS. 3 and 6, on a substrate 310, where the first to third pixels P1 to P3 and the first to third dummy pixels DP1 to DP3 are defined, the TFT Tr, the light emitting diode D, which is connected to the TFT Tr, the first bank 370, which is formed at the boundary of the adjacent pixel along the first direction X, the second bank 372, which is formed at the boundary of the adjacent pixel along the second direction Y, the first partition wall 382 being across the second pixel P2 along the second direction Y, and the second partition wall 384 being across the third pixel P3 along the second direction Y are formed.

The substrate 310 may be a glass substrate or a plastic substrate. For example, the substrate 310 may be a polyimide substrate.

The buffer layer 320 is formed on the substrate 310, and the semiconductor layer is formed on the buffer layer 320. The semiconductor layer may include an oxide semiconductor material or polycrystalline silicon.

The gate insulating layer is formed on the semiconductor layer, and the gate electrode and the gate line, each of which is formed of a conductive material, e.g., metal, is formed on the gate insulating layer. The gate electrode corresponds to a center of the semiconductor layer, and the gate line extends along the first direction X. The gate line may overlap the first bank 370.

The interlayer insulating layer, which is formed of an insulating material and includes the first and second contact holes exposing both sides of the semiconductor layer, is formed on the gate electrode.

The source electrode, the drain electrode and the data line, each of which is formed of a conductive material, e.g., metal, are formed on the interlayer insulating layer.

The source electrode and the drain electrode are spaced apart from each other with respect to the gate electrode and respectively contact both sides of the semiconductor layer through the first and second contact holes. The data line extends along the second direction Y. The data line may overlap the second bank 372.

The semiconductor layer, the gate electrode, the source electrode and the drain electrode constitute the TFT Tr. The TFT Tr may be formed in each of the first to third pixels P1 to P3 and the first to third dummy pixels DP1 to DP3.

A passivation layer (or planarization layer) 350, which includes a drain contact hole 352 exposing the drain electrode of the TFT Tr in the first to third pixels P1 to P3, is formed to cover the TFT Tr. The passivation layer 350 in the first to third dummy pixels DP1 to DP3 completely covers the TFT Tr without a drain contact hole.

The first electrode 360, which is separated in each of the first to third pixels P1 to P3 and each of the first to third dummy pixels DP1 to DP3, is formed on the passivation layer 350. The first electrode 360 in the first to third pixels P1 to P3 is connected to the drain electrode of the TFT Tr through the drain contact hole 352. The first electrode 360 in the first to third dummy pixels DP1 to DP3 is electrically floated.

The first electrode 360 may be formed of a conductive material having a relatively high work function to serve as an anode. For example, the first electrode 360 may be formed of a transparent conductive material such as indium-tin-oxide (ITO) or indium-zinc-oxide (IZO), but it is not limited thereto.

When the EL display device 300 is operated in a top-emission type, a reflection electrode or a reflection layer may be formed under the first electrode 360. For example, the reflection electrode or the reflection layer may be formed of silver (Ag) or aluminum-palladium-copper (APC) alloy. The first electrode 360 may have a triple-layered structure of ITO/APC/ITO or ITO/Ag/ITO, but it is not limited thereto.

The first and second banks 370 and 372 covering edges of the first electrode 360 are formed on the passivation layer 350. The first and second banks 370 and 372 exposes a center of the first electrode 360 in the first to third pixels P1 to P3 and the first to third dummy pixels DP1 to DP3. The first bank 370 has a thickness (or height) being smaller than the second bank 372. The second bank 372 may include first and second patterns 374 and 376 sequentially stacked.

In the second pixel column of the second pixels P2 and the second dummy pixels DP2, the first partition wall 382 being across (running across) the second pixel P2 along the second direction Y is formed. In addition, in the third pixel column of the third pixels P3 and the third dummy pixels DP3, the second partition wall 384 being across (running across) the third pixel P3 along the second direction Y is formed.

Each of the first and second partition walls 382 and 384 may be formed of the same material as the second pattern 376 of the second bank 372. Namely, each of the first and second partition walls 382 and 384 may be formed of a hydrophobic material to have a hydrophobic property. Alternatively, each of the first and second partition walls 382 and 384 may be formed of a hydrophilic material to have a hydrophilic property.

In addition, each of the first and second partition walls 382 and 384 may have a double-layered structure of a lower pattern and an upper pattern. The lower and the upper pattern may be formed of the same material as the first and second patterns 374 and 376 of the second bank 372, respectively.

Moreover, the first bank 370, the second bank 372, the first partition wall 382 and the second partition wall 384 may be formed of the same process. For example, by forming an organic material layer having a hydrophobic top surface over an entire surface of the substrate 310 and patterning the organic material layer using a half-tone mask, which includes a transmissive area, a blocking area and a half-transmissive area, the first bank 370, the second bank 372, the first partition wall 382 and the second partition wall 384 having different widths and different thicknesses may be formed.

The second bank 372 has a first height H1 from the substrate 310, and the first partition wall 382 has a second height H2 from the substrate 310. The second height H2 may be equal to or smaller than the first height H1.

The second bank 372 should have a predetermined height to reduce color mixing between adjacent pixels of different colors. However, since the light emitting layers of the same color are coated on both sides of the first partition wall 382, the first partition wall 382 may have a height being smaller than the second bank 372. In addition, the second partition wall 384 may have substantially the same height as the first partition wall 382.

For example, the second pixel P2 is divided by the first partition wall 382, but the first electrode 360 in two regions divided by the first partition wall 382 is connected to one TFT Tr. Namely, the two regions separated by the first partition wall 382 constitute the second pixel P2.

The first and second partition walls 382 and 384 does not present in the second and third dummy pixels DP2 and DP3, respectively, and are spaced apart from the second bank 372. Alternatively, the first and second partition walls 382 and 384 may be connected to the second bank 372 to be across the second and third dummy pixels DP2 and DP3, respectively, or the first and second partition walls 382 and 384 may extend into a part of the second and third dummy pixels DP2 and DP3, respectively.

The light emitting layer 362 is formed on the first electrode 360 of each pixel P1, P2, P3. For example, the light emitting layer 362 may include a first charge auxiliary layer, an emitting material layer, and a second charge auxiliary layer sequentially stacked on the first electrode 360. The light emitting material layer 362 is formed by coating red, blue, and green emitting materials on the first to third pixels P1 to P3. The emitting material may be an organic emitting material, such as a phosphorescent compound or a fluorescent compound, or an inorganic emitting material such as a quantum dot.

The first charge auxiliary layer may be a hole auxiliary layer, and the hole auxiliary layer may include at least one of a hole injection layer (HIL) and a hole transporting layer (HTL). The second charge auxiliary layer may be an electron auxiliary layer, and the electron auxiliary layer may include at least one of an electron injection layer (EIL) and an electron transporting layer (ETL). However, the present disclosure is not limited thereto.

The light emitting layer 362 is formed through a solution process. Accordingly, the process can be simplified, and a large-size and high-resolution display device can be provided. For example, the solution process may be a spin-coating method, an inkjet-printing method, or a screen-printing method, but it is not limited thereto.

For example, an emitting material solution is coated to a pixel column of the first pixels P1 and dried to form the light emitting layer 362 in the plurality of first pixels P1 arranged in the second direction Y. In this case, the light emitting layers 362 of the first pixels P1 adjacent in the second direction Y are connected to each other and are formed to cover the first bank 370.

An emitting material solution is coated to a pixel column of the second pixels P2 and dried to form the light emitting layer 362 in the plurality of second pixels P2 arranged in the second direction Y. In this case, since the first partition wall 382 being across the second pixel P2 is formed along the second direction Y, the light emitting layer 362 in the second pixel P2 is divided by the first partition wall 382.

An emitting material solution is coated to a pixel column of the third pixels P3 and dried to form the light emitting layer 362 in the plurality of third pixels P3 arranged in the second direction Y. In this case, since the second partition wall 384 being across the third pixel P3 is formed along the second direction Y, the light emitting layer 362 in the third pixel P3 is divided by the second partition wall 384.

The first partition wall 382 in the second pixel P2 and the second partition wall 384 in the third pixel P3 may correspond to the TFT Tr and/or the drain contact hole 352. Namely, the first partition wall 382 in the second pixel P2 and the second partition wall 384 in the third pixel P3 may overlap the TFT Tr and/or the drain contact hole 352.

The second electrode 364 is formed on the light emitting layer 362, the second bank 372, and the first and second partition walls 382 and 384 and over an entire of the substrate 310. The second electrode 364 may be formed of a conductive material having a relatively low work function to serve as a cathode. For example, the second electrode 364 may be formed of aluminum (Al), magnesium (Mg), silver (Ag) or their alloy. Alternatively, the second electrode 364 may be formed of a transparent conductive material such as indium-gallium-oxide (IGO), but it is not limited thereto. As mentioned above, the EL display device 300 of the present disclosure may be a top-emission type. As a result, the second electrode 364 has relatively small thickness in order to transmit the light from the light emitting layer 362.

The first electrode 360, the light emitting layer 362 and the second electrode 364 constitute the light emitting diode D.

Although not shown, an encapsulation film may be formed on or over the second electrode 364 to prevent penetration of moisture into the light emitting diode D. The encapsulation film may have a triple-layered structure of a first inorganic layer, an organic layer and a second inorganic layer, but it is not limited thereto.

In addition, a polarization plate may be disposed on the encapsulation film to reduce an ambient light reflection. The polarization plate may be a circular polarization film.

Moreover, a cover window may be attached to the encapsulation film or the polarization plate. For example, the substrate 310 and the cover window may have a flexible property such that a flexible EL display device may be provided.

In the EL display device of the present disclosure, the light emitting diode including the light emitting layer are formed in each of the pixels P1, P2, and P3, and the light emitting layer is formed by a solution process. Namely, the light emitting layer can be formed by a solution process without a mask such that the manufacturing cost of the EL display device is reduced and the EL display device having a large size and high resolution can be provided.

In addition, since the light emitting layers having the same color are integrally formed to be connected to each other, variations (or deviations) in the dropping amount of nozzles can be reduced, and a thickness of the light emitting layer in each pixel can be uniformed.

Moreover, since the first and second partition walls 382 and 384 are respectively formed in the second and third pixels P2 and P3, each of which has a width in the first direction X being larger than the first pixel P1, the solution shift problem in the second and third pixels P2 and P3 is prevented or minimized.

Furthermore, even though the light emitting layer is partially formed in the first to third dummy pixels DP1 to DP3 at the first to third pixel column by the solution shift problem, there is no problem in the emission property.

Further, since the first and second partition walls 382 and 384 are spaced apart from the second bank 272 in at least one end of the second and third pixel columns, a flow path of the fluid, i.e., an emitting material solution, is provided in the second and third pixel columns. As a result, the thickness uniformity of the organic emitting layer in the second and third pixels P2 and P3 is further improved.

Figure 8:
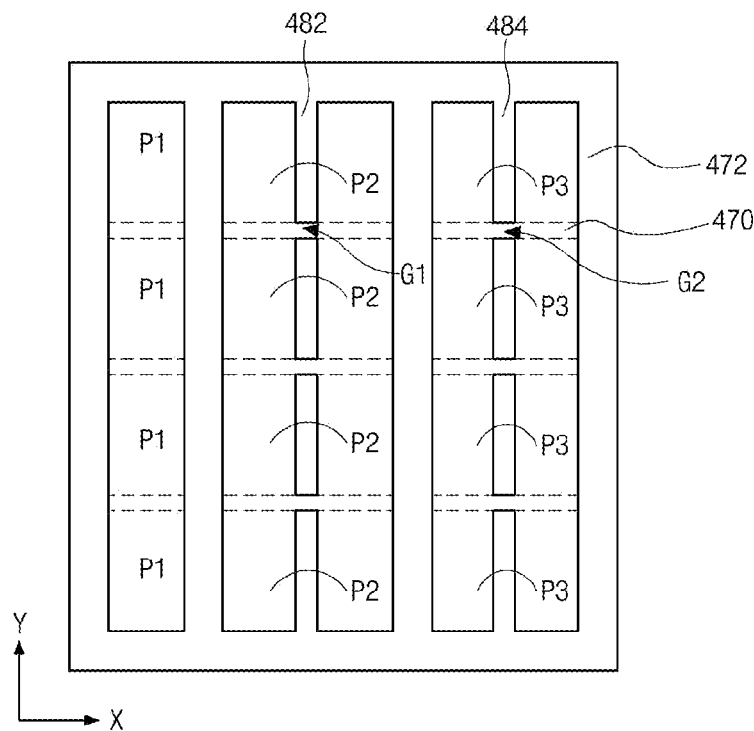
FIG. 8 is a schematic plan view of a part of an EL display device according to a fourth embodiment of the present disclosure.

FIG. 8 is a schematic plan view of a part of an EL display device according to a fourth embodiment of the present disclosure.

As shown in FIG. 8, the EL display device 400 according to the fourth embodiment of the present disclosure includes first to third pixels P1 to P3. The different color pixels are arranged along a first direction X, and the same color pixels are arranged along a second direction Y. Namely, the first to third pixels P1 to P3, which are different from each other, are sequentially arranged along the first direction X, and the first pixels P1, the second pixels P and the third pixels P are respectively arranged along the second direction Y. For example, the first pixel P1 may be a red pixel, the second pixel P2 may be a blue pixel, and the third pixel P3 may be a green pixel.

For example, the first to third pixels P1 to P3 respectively have first to third widths W1, W2 and W3, and the third width W3 is greater than the first width W1 and smaller than the second width W2.

A first bank 470 is disposed in a portion between adjacent same color pixels arranged along the second direction Y. The first bank 470 is disposed between adjacent first pixels P1, between adjacent second pixels P2, and between adjacent third pixels P3. Namely, the first pixel 470 extends between same pixels, which are adjacent along the second direction Y, along the first direction X. Alternatively, the first bank 470 may be omitted.

A second bank 472 is disposed in a portion between adjacent two pixel among the first to third pixels P1 to P3 in the first direction X. The second bank 472 is disposed between the first and second pixels P1 and P2, between the second and third pixels P2 and P3, and between the third and first pixels P3 and P1. Namely, the second bank 472 extends between different pixels, which are adjacent along the first direction X, along the second direction Y. The second bank 472 has an opening in correspondence to the same color pixels arranged along the second direction Y. The second bank 472 has a single opening in correspondence to all of the first pixels P1, all of the second pixels P2 or all of the third pixels P3 in one pixel column. The opening of the second bank 472 extends along the second direction Y, and a length of the opening in the second bank 472 in the second direction Y is larger than a length of the opening in the second bank 472 in the first direction X.

The first bank 470 may include a hydrophilic material to have a hydrophilic property. The second bank 472 may include a first pattern (not shown) including a hydrophilic material and a second pattern (not shown) including a hydrophobic material and positioned on the first pattern. In this instance, the first pattern may include the same material as the first bank 470 and may extend from the first bank 470. The second bank 472 may include the second pattern without the first pattern.

A first partition wall 482 being across a pixel column of the second pixel P2 is disposed in the second pixel P2 along the second direction Y. Namely, the second pixel P2 is divided into two regions by the first partition wall 482.

In addition, a second partition wall 484 being across a pixel column of the third pixels P3 is disposed in the third pixel P3 along the second direction Y. Namely, the third pixel P3 is divided into two regions by the second partition wall 484.

The second bank 472 may have a fourth width W4, and each of the first and second partition walls 482 and 484 may have a fifth width W5 equal to or smaller than the fourth width W4. The first partition wall 482 may has a width being equal to or larger than the second partition wall 484.

Each of the first and second partition walls 482 and 484 has a discontinuous shape. Namely, the first and second partition walls 482 and 484 respectively have first and second gaps G1 and G2.

The first gap G1 corresponds to a space between adjacent two second pixels P2, and the second gap G2 corresponds to a space between adjacent two third pixels P3. Namely, the first gap G1 corresponds to a portion of the first bank 470 between adjacent two second pixels P2, and the second gap G2 corresponds to a portion of the first bank 470 between adjacent third pixels P3.

The first gap G1 provides a flow path of the fluid, i.e., an emitting material solution, in the pixel column of the second pixels P2 such that the thickness uniformity of the light emitting layer of the light emitting diode in the second pixel P2 is improved. In addition, the second gap G2 provides a flow path of the fluid, i.e., an emitting material solution, in the pixel column of the third pixels P3 such that the thickness uniformity of the light emitting layer of the light emitting diode in the third pixel P3 is improved.

In FIG. 8, the first and second partition walls 482 and 484 are respectively disposed in the second and third pixels P2 and P3. Alternatively, the second partition wall 484 formed in the third pixel P3, which has a width being smaller than the second pixel P2, may be omitted.

In FIG. 8, the first and second partition walls 482 and 484 are connected to the second bank 472 at an end of each of the pixel column of the second pixels P2 and the pixel column of the third pixels P3. Alternatively, at least one of the first and second partition walls 482 and 484 may be spaced apart from the second bank 472 at the end of each of the pixel column of the second pixels P2 and the pixel column of the third pixels P3.

In addition, a dummy pixel may be disposed at both ends of the pixel column of the first pixels P1 arranged in the second direction, at both ends of the pixel column of the second pixels P2 arranged in the second direction, and at both ends of the pixel column of the third pixels P3 arranged in the second direction.

In the EL display device of the present disclosure, the light emitting diode including the light emitting layer are formed in each of the pixels P1, P2, and P3, and the light emitting layer is formed by a solution process. Namely, the light emitting layer can be formed by a solution process without a mask such that the manufacturing cost of the EL display device is reduced and the EL display device having a large size and high resolution can be provided.

In addition, since the light emitting layers having the same color are integrally formed to be connected to each other, variations (or deviations) in the dropping amount of nozzles can be reduced, and a thickness of the light emitting layer in each pixel can be uniform.

Moreover, since the first and second partition walls 482 and 484 are respectively formed in the second and third pixels P2 and P3, each of which has a width in the first direction X being larger than the first pixel P1, the solution shift problem in the second and third pixels P2 and P3 is prevented or reduced.

Furthermore, since a flow path of the fluid is provided by the first and second gaps G1 and G2 of the first and second partition walls 482 and 484, the thickness uniformity of the light emitting layer in the second and third pixels P2 and P3 is further improved.

Figure 9:
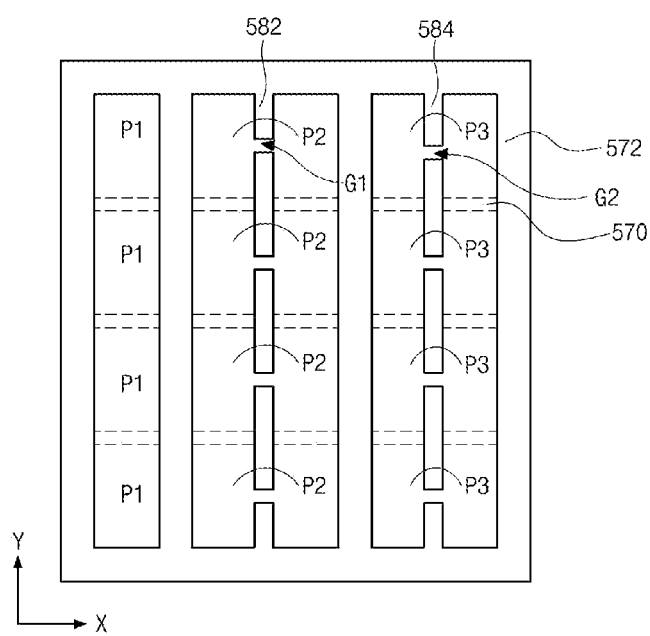
FIG. 9 is a schematic plan view of a part of an EL display device according to a fifth embodiment of the present disclosure.

FIG. 9 is a schematic plan view of a part of an EL display device according to a fifth embodiment of the present disclosure.

As shown in FIG. 9, the EL display device 400 according to the fourth embodiment of the present disclosure includes first to third pixels P1 to P3. The different color pixels are arranged along a first direction X, and the same color pixels are arranged along a second direction Y. Namely, the first to third pixels P1 to P3, which are different from each other, are sequentially arranged along the first direction X, and the first pixels P1, the second pixels P and the third pixels P are respectively arranged along the second direction Y. For example, the first pixel P1 may be a red pixel, the second pixel P2 may be a blue pixel, and the third pixel P3 may be a green pixel.

For example, the first to third pixels P1 to P3 respectively have first to third widths W1, W2 and W3, and the third width W3 is greater than the first width W1 and smaller than the second width W2.

A first bank 570 is disposed in a portion between adjacent same color pixels arranged along the second direction Y. The first bank 570 is disposed between adjacent first pixels P1, between adjacent second pixels P2, and between adjacent third pixels P3. Namely, the first pixel 570 extends between same pixels, which are adjacent along the second direction Y, along the first direction X. Alternatively, the first bank 570 may be omitted.

A second bank 572 is disposed in a portion between adjacent two pixel among the first to third pixels P1 to P3 in the first direction X. The second bank 572 is disposed between the first and second pixels P1 and P2, between the second and third pixels P2 and P3, and between the third and first pixels P3 and P1. Namely, the second bank 572 extends between different pixels, which are adjacent along the first direction X, along the second direction Y. The second bank 572 has an opening in correspondence to the same color pixels arranged along the second direction Y. The second bank 572 has a single opening in correspondence to all of the first pixels P1, all of the second pixels P2 or all of the third pixels P3 in one pixel column. The opening of the second bank 572 extends along the second direction Y, and a length of the opening in the second bank 572 in the second direction Y is larger than a length of the opening in the second bank 572 in the first direction X.

The first bank 570 may include a hydrophilic material to have a hydrophilic property. The second bank 572 may include a first pattern (not shown) including a hydrophilic material and a second pattern (not shown) including a hydrophobic material and positioned on the first pattern. In this instance, the first pattern may include the same material as the first bank 570 and may extend from the first bank 570. The second bank 572 may include the second pattern without the first pattern.

A first partition wall 582 being across a pixel column of the second pixel P2 is disposed in the second pixel P2 along the second direction Y. Namely, the second pixel P2 is divided into two regions by the first partition wall 582.

In addition, a second partition wall 584 being across a pixel column of the third pixels P3 is disposed in the third pixel P3 along the second direction Y. Namely, the third pixel P3 is divided into two regions by the second partition wall 584.

The second bank 572 may have a fourth width W4, and each of the first and second partition walls 582 and 584 may have a fifth width W5 equal to or smaller than the fourth width W4. The first partition wall 582 may has a width being equal to or larger than the second partition wall 584.

Each of the first and second partition walls 582 and 584 has a discontinuous shape. Namely, the first and second partition walls 582 and 584 respectively have first and second gaps G1 and G2.

The first gap G1 corresponds to a portion of the second pixel P2, and the second gap G2 corresponds to a portion of the third pixel P3. Namely, the first gap G1 is positioned between adjacent two first banks 570 in the pixel column of the second pixels P2, and the second gap G2 is positioned between adjacent two first banks 570 in the pixel column of the third pixels P3.

The first gap G1 provides a flow path of the fluid, i.e., an emitting material solution, in the pixel column of the second pixels P2 such that the thickness uniformity of the light emitting layer of the light emitting diode in the second pixel P2 is improved. In addition, the second gap G2 provides a flow path of the fluid, i.e., an emitting material solution, in the pixel column of the third pixels P3 such that the thickness uniformity of the light emitting layer of the light emitting diode in the third pixel P3 is improved.

In FIG. 9, the first and second partition walls 582 and 584 are respectively disposed in the second and third pixels P2 and P3. Alternatively, the second partition wall 584 formed in the third pixel P3, which has a width being smaller than the second pixel P2, may be omitted.

In FIG. 9, the first and second partition walls 582 and 584 are connected to the second bank 572 at an end of each of the pixel column of the second pixels P2 and the pixel column of the third pixels P3. Alternatively, at least one of the first and second partition walls 582 and 584 may be spaced apart from the second bank 572 at the end of each of the pixel column of the second pixels P2 and the pixel column of the third pixels P3.

In addition, a dummy pixel may be disposed at both ends of the pixel column of the first pixels P1 arranged in the second direction, at both ends of the pixel column of the second pixels P2 arranged in the second direction, and at both ends of the pixel column of the third pixels P3 arranged in the second direction.

In the EL display device of the present disclosure, the light emitting diode including the light emitting layer are formed in each of the pixels P1, P2, and P3, and the light emitting layer is formed by a solution process. Namely, the light emitting layer can be formed by a solution process without a mask such that the manufacturing cost of the EL display device is reduced and the EL display device having a large size and high resolution can be provided.

In addition, since the light emitting layers having the same color are integrally formed to be connected to each other, variations (or deviations) in the dropping amount of nozzles can be reduced, and a thickness of the light emitting layer in each pixel can be uniform.

Moreover, since the first and second partition walls 582 and 584 are respectively formed in the second and third pixels P2 and P3, each of which has a width in the first direction X being larger than the first pixel P1, the solution shift problem in the second and third pixels P2 and P3 is prevented or minimized.

Furthermore, since a flow path of the fluid is provided by the first and second gaps G1 and G2 of the first and second partition walls 582 and 584, the thickness uniformity of the light emitting layer in the second and third pixels P2 and P3 is further improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An electroluminescent display device, comprising:
   a substrate including a first pixel column and a second pixel column, wherein the first pixel column and the second pixel column respectively include a plurality of first pixels and a plurality of second pixels arranged in a first direction and respectively have a first width and a second width in a second direction perpendicular to the first direction, and wherein the second pixel column is positioned in the second direction from the first pixel column, and the second width is greater than the first width;
   a light emitting diode in each first pixel from the plurality of first pixels and each second pixel from the plurality of second pixels, the light emitting diode including a first electrode, a light emitting layer and a second electrode;
   a first bank positioned between adjacent first pixels from the plurality of first pixels and between adjacent second pixels from the plurality of second pixels and covering an edge of the first electrode;
   a second bank positioned between the first pixel column and the second pixel column and extending along the first direction; and
   a first partition wall being across the second pixel column along the first direction and positioned on the first electrode,
   wherein the second bank includes a first portion at a first side of the second pixel column and a second portion at a second side of the second pixel column, and
   wherein the first electrode is disposed between the first portion and the first partition wall and between the second portion and the first partition wall.

2. The electroluminescent display device according to claim 1, wherein the substrate further includes a third pixel column including a plurality of third pixels arranged in the first direction and has a third width in the second direction,
   wherein the electroluminescent display device further comprises: a second partition wall being across the third pixel column along the first direction and positioned on the first electrode, and
   wherein the third pixel column is positioned in the second direction from the second pixel column, and the third width is greater than the first width and smaller than the second width.

3. The electroluminescent display device according to claim 2, wherein the second bank further includes a third portion extending along the second direction, and wherein each of the first partition wall and the second partition wall extends from the third portion of the second bank.

4. The electroluminescent display device according to claim 2, wherein the second bank further includes a third portion extending along the second direction, and wherein the first partition wall is spaced apart from the third portion of the second bank by a first distance, and the second partition wall is spaced apart from the third portion of the second bank by a second distance, and wherein the first distance is equal to or larger than the second distance.

5. The electroluminescent display device according to claim 2, wherein the first pixel column further includes a first dummy pixel, the second pixel column further includes a second dummy pixel, and the third pixel column further includes a third dummy pixel.

6. The electroluminescent display device according to claim 5, wherein the second bank further includes a third portion extending along the second direction, and wherein the first partition wall extends into a portion of the second dummy pixel to have a first distance from the third portion of the second bank, and the second partition wall extends into a portion of the third dummy pixel to have a second distance from the third portion of the second bank,
   wherein the first distance is equal to or larger than the second distance.

7. The electroluminescent display device according to claim 5, wherein the second bank further includes a third portion extending along the second direction, and wherein the first partition wall and the second partition wall are respectively spaced apart from the third portion of the second bank by the first dummy pixel and the second dummy pixel.

8. The electroluminescent display device according to claim 2, wherein the second partition wall has a width being equal to or smaller than the first partition wall.

9. The electroluminescent display device according to claim 2, wherein the second partition wall includes a second gap corresponding to the first bank.

10. The electroluminescent display device according to claim 1, wherein the second bank further includes a third portion extending along the second direction, and wherein the first partition wall extends from the third portion of the second bank.

11. The electroluminescent display device according to claim 1, wherein the first partition wall is spaced apart from the second bank.

12. The electroluminescent display device according to claim 1, wherein the first partition wall has a width being equal to or less than a width of the second bank.

13. The electroluminescent display device according to claim 1, wherein the first partition wall has a height being equal to or less than a height of the second bank.

14. The electroluminescent display device according to claim 1, wherein the first partition wall includes a first gap corresponding to the first bank.

15. The electroluminescent display device according to claim 14, wherein the first gap corresponds to the second pixel.

16. The electroluminescent display device according to claim 1, wherein the second pixel column further includes a dummy pixel at both ends.

17. The electroluminescent display device according to claim 16, wherein the first partition wall extends into the dummy pixel.

18. The electroluminescent display device according to claim 16, wherein the second bank further includes a third portion extending along the second direction, and
    wherein the first partition wall is spaced apart from the second bank by the dummy pixel.

19. The electroluminescent display device according to claim 16, further comprising:
    a thin film transistor between the substrate and the first electrode, wherein the first electrode is connected to the thin film transistor.

20. The electroluminescent display device according to claim 1, wherein the second pixel is divided into first region and a second region by the first partition wall,
  wherein the first electrode in the first region and the first electrode in the second region are connected to each other, and the light emitting layer in the first region and the light emitting layer in the second region are separated from each other.

21. The electroluminescent display device according to claim 1, wherein the light emitting layers in the second pixel column are continuous in adjacent second pixels and are separated in one second pixel by the first partition wall.

22. The electroluminescent display device according to claim 9, wherein the second gap corresponds to a third pixel from the plurality of third pixels.

23. The electroluminescent display device according to claim 1, wherein the light emitting layer is formed by a solution process without a mask.

24. The electroluminescent display device according to claim 1, wherein the second bank further includes a third portion extending along the second direction, and
  wherein the first partition wall is spaced apart from the third portion of the second bank.

25. An electroluminescent display device, comprising:
  a substrate including a first pixel column and a second pixel column, wherein the first pixel column and the second pixel column respectively include a plurality of first pixels and a plurality of second pixels arranged in a first direction and respectively have a first width and a second width in a second direction perpendicular to the first direction, and wherein the second pixel column is positioned in the second direction from the first pixel column, and the second width is greater than the first width;
  a light emitting diode in each first pixel from the plurality of first pixels and each second pixel from the plurality of second pixels, the light emitting diode including a first electrode, a light emitting layer and a second electrode;
  a first bank positioned between adjacent first pixels from the plurality of first pixels and between adjacent second pixels from the plurality of second pixels and covering an edge of the first electrode;
  a second bank positioned between the first pixel column and the second pixel column and extending along the first direction; and
  a first partition wall being across the second pixel column along the first direction and positioned on the first electrode,
  wherein light emitting layers in the second pixel column are continuous in adjacent second pixels and are separated in one second pixel by the first partition wall.

* * * * *